US012719483B2

(12) United States Patent
Sjöland

(10) Patent No.: US 12,719,483 B2
(45) Date of Patent: Aug. 25, 2026

(54) MULTI-CARRIER TRANSCEIVER AND MULTI-FREQUENCY PLL SYSTEM

(71) Applicant: Telefonaktiebolaget LM Ericsson (publ), Stockholm (SE)

(72) Inventor: Henrik Sjöland, Lund (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 306 days.

(21) Appl. No.: 18/567,635

(22) PCT Filed: Jun. 18, 2021

(86) PCT No.: PCT/EP2021/066599
§ 371 (c)(1),
(2) Date: Dec. 6, 2023

(87) PCT Pub. No.: WO2022/262995
PCT Pub. Date: Dec. 22, 2022

(65) Prior Publication Data

US 2024/0275392 A1 Aug. 15, 2024

(51) Int. Cl.
*H03L 7/099* (2006.01)
*G06F 1/12* (2006.01)
(Continued)

(52) U.S. Cl.
CPC .............. *H03L 7/099* (2013.01); *H03L 7/093* (2013.01)

(58) Field of Classification Search
None
See application file for complete search history.

(56) References Cited

U.S. PATENT DOCUMENTS 5,329,251 A 7/1994 Llewellyn
5,909,474 A 6/1999 Yoshizawa
(Continued)

FOREIGN PATENT DOCUMENTS

EP 0780985 A1 6/1997
EP 2264903 A1 12/2010
(Continued)

OTHER PUBLICATIONS

Razavi, B., "A Study of Injection Locking and Pulling in Oscillators", IEEE Journal of Solid-State Circuits, vol. 39, No. 9, Sep. 2004, pp. 1415-1424, IEEE.
(Continued)

*Primary Examiner* — Tuan A Tran
(74) *Attorney, Agent, or Firm* — COATS & BENNETT, PLLC

(57) ABSTRACT

A multi-carrier transceiver receives and transmits wireless communication signals on multiple carriers simultaneously. To generate Local Oscillator (LO) signals for mixers operating at different frequencies, a multi-frequency LO signal generating circuit includes a set of integer-N Phase Locked Loop (PLL) circuits. All PLL circuits receive the same reference frequency, but output different frequency LO signals, each at an integer multiple of the reference frequency. The LO signal frequencies are thus on an equidistant frequency grid having a granularity of the reference frequency. Spurs are also at multiples of the reference frequency, and can be easily filtered. A fractional-N PLL circuit may generate the reference frequency, making the frequency grid adjustable. A plurality of the PLL circuits in the set output a phase error feedback signal to a phase error correction circuit, and receive a phase error control signal that phase-locks the plurality of PLL circuits together and mitigates phase noise deviations between them. PLL circuits
(Continued)

operating near a transmitter frequency are not in the phase-locked plurality, so all PLL circuits are not frequency pulled. Complex channel select filters are used for carriers not aligned with a LO signal.

15 Claims, 8 Drawing Sheets

(51) Int. Cl.
*H03L 7/08* (2006.01)
*H03L 7/093* (2006.01)
*H04L 7/033* (2006.01)

(56) References Cited

U.S. PATENT DOCUMENTS 5,943,380 A 8/1999 Marchesani et al.
5,977,806 A 11/1999 Kikuchi
6,314,074 B1 11/2001 Kuribayashi
6,337,891 B1 1/2002 Kim
7,535,958 B2 * 5/2009 Best .................... H04B 1/7183 375/256
7,653,163 B2 * 1/2010 Sadri .................... H04B 1/0057 375/349
7,860,190 B2 12/2010 Feller
8,406,366 B2 3/2013 Hattori et al.
8,415,999 B2 4/2013 Ding et al.
9,225,507 B1 * 12/2015 Lye .................... H03L 7/235
9,979,408 B2 * 5/2018 Mayer .................... H03L 7/087
10,135,478 B2 * 11/2018 Chi .................... H04B 1/38
10,200,049 B2 * 2/2019 Bisanti .................... H03L 7/185
10,924,122 B2 * 2/2021 Nilsson .................... G06F 1/04
10,931,498 B1 * 2/2021 Dorosenco ............ H03L 7/1976
11,171,656 B2 11/2021 Grout
11,296,860 B2 * 4/2022 Sridharan ............... H03L 7/087
11,671,104 B2 6/2023 Tak
11,677,405 B2 6/2023 Sjoland
11,743,026 B2 * 8/2023 Sridharan ............. H04L 7/0331 375/262
2005/0090208 A1 * 4/2005 Liao .................... H04B 1/406 455/76
2008/0232531 A1 9/2008 Feller
2010/0102889 A1 4/2010 Azenkot
2011/0248755 A1 10/2011 Hasenplaugh et al.
2017/0063382 A1 3/2017 Srivastava
2017/0237549 A1 * 8/2017 Lakdawala ............. H04L 7/033 375/362
2018/0294832 A1 * 10/2018 Chi .................... H03L 7/099
2019/0131979 A1 5/2019 Nilsson
2019/0372576 A1 * 12/2019 Jung .................... H03B 5/1212
2021/0044472 A1 2/2021 Dorosenco et al.
2022/0085821 A1 3/2022 Gao

FOREIGN PATENT DOCUMENTS

EP 2843839 A1 8/2014
EP 2819131 A1 12/2014
EP 2819131 B1 8/2019
EP 2843839 B1 3/2020
JP H0983587 A 3/1997
JP 2004072714 A 3/2004
JP 2020027966 A 2/2020
TW 201225544 A 6/2012
WO 2021121637 A1 6/2021
WO 2022199852 A1 9/2022

OTHER PUBLICATIONS

Anand Iyer, S.P. et al., "Phase-Frequency Synthesis Using PLL-Networks", 2008 Joint 6th International IEEE Northeast Workshop on Circuits and Systems and TAISA Conference, Jun. 22-25, 2008, pp. pp. 5-8, IEEE.

Agrawal, A. et al., "A Scalable 28GHz Coupled-PLL in 65nm CMOS with Single-Wire Synchronization for Large-Scale 5G mm-Wave Arrays", 2016 IEEE International Solid-State Circuits Conference, Digest of Technical Papers, Feb. 1, 2016, pp. 38-40, IEEE.

* cited by examiner

MULTI-CARRIER TRANSCEIVER AND MULTI-FREQUENCY PLL SYSTEM

TECHNICAL FIELD

The present invention relates generally to wireless communication system circuits, and in particular to a multi-carrier transceiver and a system of generating Local Oscillator signals for it at different frequencies, with low phase noise.

BACKGROUND

Wireless communication networks, including network nodes and radio network devices such as cellphones and smartphones, are ubiquitous in many parts of the world. These networks continue to grow in capacity and sophistication. To accommodate both more users and a wider range of types of devices that may benefit from wireless communications, the technical standards governing the operation of wireless communication networks continue to evolve. The fourth generation of network standards has been deployed (4G, also known as Long Term Evolution, or LTE), the fifth generation is in development (5G, also known as New Radio, or NR), and the sixth generation (6G) is being planned.

One important aspect of the development of wireless communication networks is the addition of new frequency bands, to increase system capacity and data rates. For example, it is envisioned that 6G will include carrier frequencies in the range 7-15 GHz. Network equipment will thus require flexible solutions with a high degree of integration, and be capable of receiving and transmitting at multiple frequency bands. It would also be advantageous to have integrated circuits capable of receiving and transmitting a number of concurrent carriers.

One way of handling multiple carriers is to process an entire frequency range, e.g., 7-15 GHz, in a single data converter. For a receiver, this requires a very wideband Analog to Digital Converter (ADC), which is challenging to design. Achieving a high dynamic range in a track and hold circuit at such high frequencies is also a major challenge. Radio Frequency (RF) filters are also needed for the different carriers, to avoid distortion due to out-of-carrier signals. That means the signals are first filtered and amplified separately, and then combined before being processed by an ADC. Such a wideband ADC would consume a substantial amount of power. For a transmitter, there must be a corresponding wideband Digital to Analog Converter (DAC), after which separate power amplifier chains and filters can process the analog signal. The DAC must have high linearity, processing several carriers with low cross modulation and intermodulation distortion, and its power consumption would also be considerable.

One benefit of using wideband converters for processing all carriers is that a single clock frequency could be used, generated by one oscillator circuit. There would thus be no problem of coupling between oscillators operating at different frequencies, which causes spurious signals. Knowing the potential carrier frequencies, it would also be possible to choose the clock frequency so that frequency "pulling" problems between transmitters and nearby (in frequency) oscillators are minimized. However, operating a wideband converter processing the full band incurs substantial cost.

More efficient would be a design employing more narrowband converters. In such a design, only the carrier signals are converted, and not what lies in between. Additionally, the signals would be converted to baseband so that the track and hold circuit can more readily achieve a high dynamic range. However, this requires frequency conversion mixers, with different Local Oscillator (LO) frequencies, which in turn requires multiple Phase Locked Loops (PLLs) with oscillators.

In addition to the desire to process multiple carriers together, other developments in modern wireless communication networks require a proliferation of PLLs. One such development is the use of spatial diversity and/or spatial multiplexing. Spatial diversity refers to transmitting the same signal on different propagation paths (e.g., different transmit/receive antennas), which increases robustness against fading, co-channel interference, and other deleterious effects of RF signal transmission. Spatial multiplexing also uses multiple transmit and receive antennas, and refers to transmitting different portions of data on different propagation paths, using space-time coding, to increase data rates. These techniques are collectively referred to as Multiple Input, Multiple Output, or "MIMO." The key to all MIMO techniques is the deployment of multiple antennas, on at least one and preferably both sides of the air interface channel. 4G network standards contemplate 2, 4, or 8 antennas per transceiver; 5G networks envision up to 128 antennas per transceiver; and the number could go far higher in 6G networks. In highly parallel architectures, each antenna used to transmit or receive an RF signal is associated with a dedicated transceiver. Each transceiver requires an LO signal to perform frequency conversion between carrier frequencies and baseband. For efficient, low power processing of received signals, and for the transmission of coherent signals from multiple antennas, phase coherence of the multiple LO signals is important.

Another advanced feature of modern wireless communication networks which imposes a requirement for multiple PLLs is beamforming, wherein the directionality of an RF transmission is increased and controlled to "aim" in a specific direction. This may be accomplished by the use of a phased-array antenna comprising a large plurality of antenna elements. The relative phases of transmit signals sent to each antenna element are controlled to create constructive or destructive interference, thus amplifying the signal in some spatial directions and attenuating it in others, and hence controlling the direction in which the beam is transmitted. Similar phase manipulation of signals from antenna elements in a receive antenna can also result in beamforming the sensitivity of a phased-array antenna in receiving signals. In such beamforming systems, the LO signals at each antenna element transceiver must be phase-aligned, to allow for precise control of the phase offsets.

One challenge in multi-PLL designs how to mitigate spurs due to coupling between oscillators. Another significant challenge is how to mitigate pulling between oscillators and transmitters that are close in frequency. A third challenge is how to achieve a low phase noise in many PLLs, not just scaling power consumption and chip area linearly with number of PLLs without any phase noise improvements. In particular, high frequency noise in a reference frequency signal input to the PLLs can propagate to the LO signals they generate, introducing phase noise which limits performance in all of the applications discussed above.

The Background section of this document is provided to place embodiments of the present invention in technological and operational context, to assist those of skill in the art in understanding their scope and utility. Approaches described in the Background section could be pursued, but are not necessarily approaches that have been previously conceived or pursued. Unless explicitly identified as such, no statement herein is admitted to be prior art merely by its inclusion in the Background section.

SUMMARY

The following presents a simplified summary of the disclosure in order to provide a basic understanding to those of skill in the art. This summary is not an extensive overview of the disclosure and is not intended to identify key/critical elements of embodiments of the invention or to delineate the scope of the invention. The sole purpose of this summary is to present some concepts disclosed herein in a simplified form as a prelude to the more detailed description that is presented later.

Embodiments of the present invention described and claimed herein provide an architecture for a transceiver chip with multiple channels, for receiving or transmitting multiple carriers. Each channel features an antenna switch, connected to an external RF filter, a receive chain, and a transmit chain. The receive chain features a low noise amplifier (LNA), frequency down-conversion mixer, filter, and an ADC. The transmit chain features a power amplifier, frequency up-conversion mixer, filter, and a DAC. The LO signals to the mixers in different channels are at different frequencies, to receive and transmit carriers at different frequencies. Not all channels are necessarily active processing carriers, and some channels may process more than one carrier if close in frequency.

The LO signals are generated on an equidistant frequency grid. To generate these signals, a number of integer-N PLLs operate with same reference frequency, but with different (integer) division numbers in their feedback paths. To improve the phase noise, a plurality of the PLLs provide phase deviation information to, and receive a common adjustment signal from, a PLL synchronization circuit. PCT application no. PCT/EP2019/086845, filed Dec. 20, 2019, discloses a system and method of phase noise improvement for a system of interconnected PLLs, which is particularly suited for digital PLL implementations. PCT application no. PCT/EP2021/058001, filed Mar. 26, 2021, discloses a different approach to phase noise improvement for a system of interconnected PLLs, which is particularly suited for analog PLL implementations. Both of these references are assigned to the assignee of the present disclosure, and both are incorporated by reference herein, in their entireties. Both of these references describe a system of interconnected PLLs, all of which operate at the same oscillator frequency. According to embodiments of the present invention, similar integration is applied to a plurality of PLLs operating at different oscillator frequencies. However, because the PLLs operate based on the same reference frequency, the PLLs can still be phase-locked together. This also reduces the risk of pulling between oscillators through harmonics/subharmonics, that can otherwise occur although the fundamental frequencies are different.

Spurs at multiples of the frequency grid distance are inevitable due to pulling between oscillators. Their effect on the transceiver system, however, can be mitigated by RF filters, suppressing signals outside the desired carriers in both reception and transmission. The coupling can also be reduced by using figure-eight shaped inductors, as disclosed in EP patent application no. EP 2,819, 131, assigned to the assignee of the present disclosure, and incorporated by reference herein, in its entirety.

Frequency pulling of an oscillator by a transmitter operating close in frequency is a well-known phenomenon, which occurs as a result of coupling between inductors, through the power supply lines, and through the substrate. More information on oscillator frequency pulling is provided in the paper by Behzad Razavi, "A Study of Injection Locking and Pulling in Oscillators," published in the IEEE Journal of Solid-State Circuits, Vol. 39, No. 9, September 2004, p. 1415-24, the disclosure of which is incorporated herein by reference in its entirety. To reduce such pulling, the oscillator can operate at a multiple frequency, for instance twice the LO frequency, with its output being divided by two. Even then, there can still be coupling from the power amplifier 2nd order harmonic. To mitigate such pulling, the PLL system can make the affected oscillator more immune. One measure is to remove that PLL from the cooperative phase noise mitigation scheme of the plurality of PLLs. Phase deviations in that oscillator will then not affect the phase of the rest of the PLL system, which remains stable. The cost of this isolation is that the phase noise mitigation in the interconnected PLLs will decrease slightly, due to loss of the energy of one participating oscillator. Another measure is to increase the bandwidth of the difference loop in the affected PLL, to further stabilize the oscillator and counteract phase modulation.

In one embodiment, the filters in the receivers and transmitters are complex analog filters, so their passbands do not necessarily have to be centered around baseband DC. This means the carrier can still be filtered before the ADC, or after the DAC, even if it is not centered at the LO frequency.

In one embodiment, to further increase the flexibility of the system, the common reference frequency of the PLLs is generated by a fractional-N PLL with high frequency resolution. This allows fine tuning of the reference frequency, making the frequency grid adjustable, which may help to obtain the best compromise for all carriers being processed.

One embodiment relates to a multi-frequency Local Oscillator (LO) signal generating circuit, configured to receive one reference signal and to generate and output a set of LO signals. The multi-frequency LO signal generating circuit includes a set of Phase Locked Loop (PLL) circuits, each configured to receive a frequency input signal at the reference signal frequency and a common adjustment signal, and to output an LO signal. The LO signal frequency is an integer multiple of the frequency input signal. At least two PLL circuits are configured to output different frequency LO signals. A plurality of PLL circuits in the set of PLL circuits output a phase deviation signal. The multi-frequency LO signal generating circuit also includes a PLL synchronization circuit configured to receive phase deviation signals from the plurality of PLL circuits, and output a common adjustment signal. The PLL synchronization circuit is configured to synchronize operation of the plurality of PLL circuits such that they lock together with wide bandwidth, and mitigate propagation of high frequency reference signal noise to the LO signals.

Another embodiment relates to a multi-carrier transceiver for a wireless communication network node or wireless device. The multi-carrier transceiver includes the LO signal generating circuit described above. The multi-carrier transceiver also includes mixers configured to frequency convert wireless communication signals between baseband and a plurality of RF carrier frequencies. The multi-carrier transceiver further includes filters configured to suppress signal energy outside of a frequency band around each carrier frequency.

Yet another embodiment relates to a multi-carrier transceiver integrated circuit (IC) for a wireless communication network node or wireless device. The multi-carrier transceiver IC includes a plurality of channels. Each channel includes an antenna switch connected to an external RF filter; a receive (Rx) chain of circuits; and a transmit (Tx) chain of circuits. The Rx chain includes a low noise amplifier, frequency down-conversion mixer, filter, and analog to digital converter (ADC). The Tx chain includes a power amplifier, frequency up-conversion mixer, filter, and digital to analog converter (DAC). The multi-carrier transceiver IC also includes the LO signal generating circuit described above. LO signals provided to the mixers in different channels have corresponding different frequencies, and the different channels are configured to process different carrier frequency signals.

Still another embodiment relates to a method of generating a set of periodic signals at different frequencies. A set of integer-N PLL circuits is provided. Divider values in at least two PLL circuits of the set are set to different integers, to generate at least two LO signals having different frequencies. The frequency of each LO signal is an integer multiple of a reference frequency. A signal at a reference signal frequency, and a common adjustment signal, are applied to each PLL circuit in the set of PLL circuits. At a PLL synchronization circuit, a phase deviation signal is received from each of the plurality of PLL circuits. The PLL synchronization circuit outputs the common adjustment signal. The PLL synchronization circuit is configured to synchronize operation of the plurality of PLL circuits such that they lock together with wide bandwidth, and mitigate propagation of high frequency reference signal noise to the LO signals. Still another embodiment relates to User Equipment (UE) operative in a wireless communication network. The UE includes the multi-carrier transceiver described above, and processing circuitry operatively connected to the multi-carrier transceiver and configured to communicate with one or more nodes of a wireless communication network across a Radio Access Network.

Still another embodiment relates to a base station operative in a wireless communication network. The base station includes the multi-carrier transceiver described above, and processing circuitry operatively connected to the multi-carrier transceiver and configured to communicate with a plurality of User Equipment (UE) across a Radio Access Network.

BRIEF DESCRIPTION OF THE DRAWINGS

The present invention will now be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. Like numbers refer to like elements throughout.

DETAILED DESCRIPTION

For simplicity and illustrative purposes, the present invention is described by referring mainly to an exemplary embodiment thereof. In the following description, numerous specific details are set forth in order to provide a thorough understanding of the present invention. However, it will be readily apparent to one of ordinary skill in the art that the present invention may be practiced without limitation to these specific details. In this description, well known methods and structures have not been described in detail so as not to unnecessarily obscure the present invention.

Embodiments of the present invention are described herein with reference to a base station for the new frequency range 7-15 GHz. The base-station is designed to process (i.e., transmit or receive signals on) up to four different carrier frequencies concurrently, with digital beamforming in each. For each antenna signal, each carrier is filtered by a separate RF filter. For example, if there are 64 antenna elements, there will be 256 RF filters.

Figure 1:
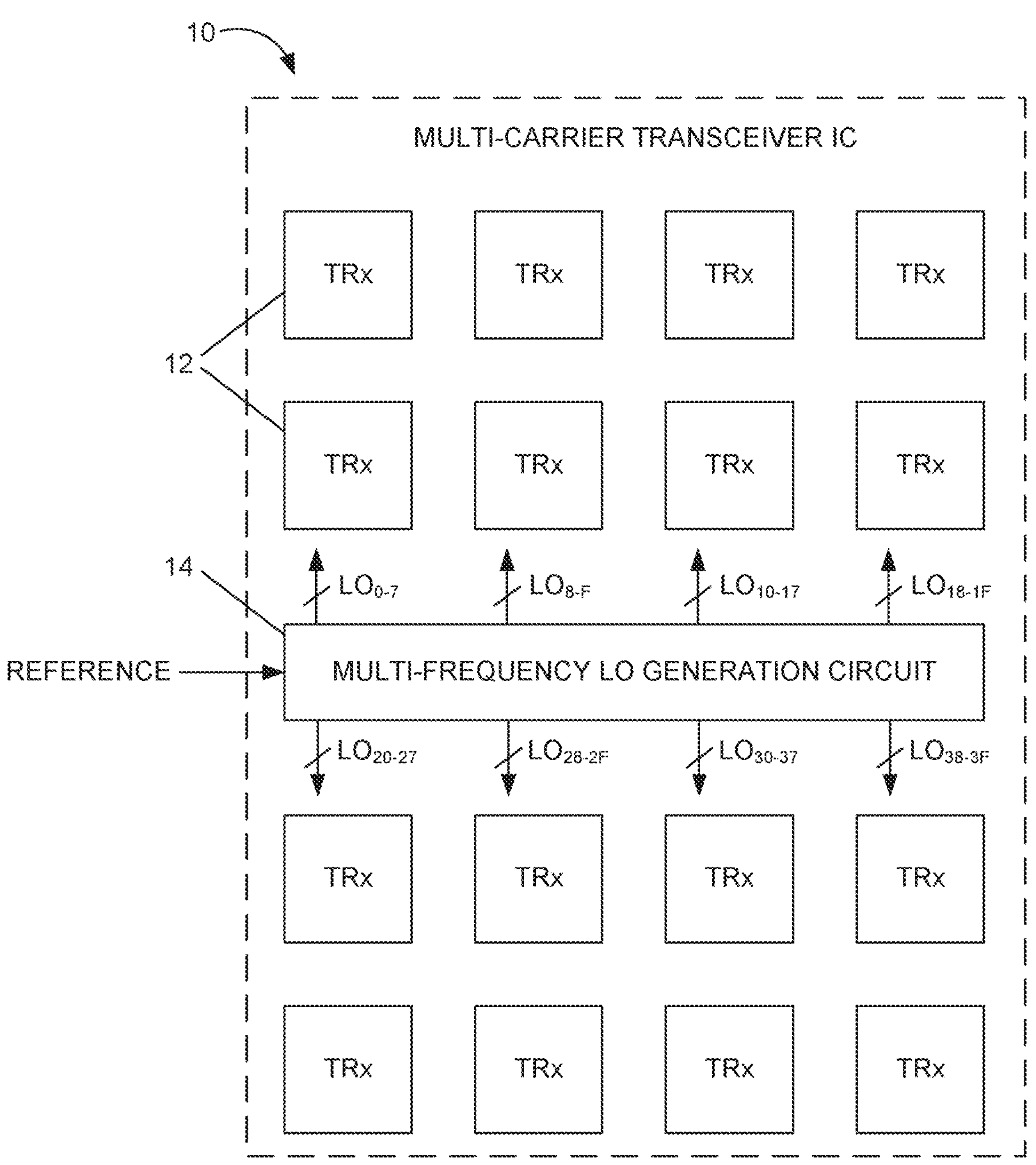
FIG. 1 is a block diagram floorplan of a multi-carrier transceiver IC.

FIG. 1 depicts a representative floorplan of a multi-carrier transceiver IC 10, comprising a plurality of transceiver circuits 12, and a multi-frequency Local Oscillator (LO) signal generating circuit 14, implemented on the same chip. Each RF filter is connected to a port of a transceiver circuit 12. If each multi-carrier transceiver IC 10 has 16 transceiver ports as illustrated, it can handle four antenna elements with four carriers. In the floorplan depicted in FIG. 1, the multi-frequency LO signal generating circuit 14, which includes Phase Locked Loop (PLL) circuits to generate the required LO signals, is located at the center of the IC. Those of skill in the art will readily recognize that circuits of the multi-carrier transceiver IC 10 may be organized in many different ways, e.g., with different numbers of transceivers and PLLs placed on each multi-carrier transceiver IC 10, with the PLL circuits of the multi-frequency LO signal generating circuit 14 distributed among the transceiver circuits 12, and the like.

The multi-frequency LO signal generating circuit 14 generates one or two (depending on the frequency plan) dedicated LO frequency signals for the transceivers in each column. The transceivers each receive or transmit one of the carriers. As mentioned above, in another embodiment, the PLL circuits of the multi-frequency LO signal generating circuit can be more distributed. In the extreme case, a local PLL circuit is placed adjacent each transceiver on the multi-carrier transceiver IC 10. Regardless of how the PLL circuits are distributed, nominally all the PLL circuits (with exceptions described herein) are connected to form a synchronized system.

The multi-frequency LO signal generating circuit 14 has a single reference frequency input, and a set of LO signal outputs. The reference signal (or a different signal, but at the reference signal frequency) is distributed to all the PLL circuits in the multi-frequency LO signal generating circuit 14, synchronizing them in frequency and phase. Different LO signals are at different frequencies, to enable the reception and transmission of different carriers. However, the LO signal frequencies are on a frequency grid, having a granularity of the reference frequency. That is, all PLL circuits in the multi-frequency LO signal generating circuit 14 generate signals at integer multiples of the reference frequency. That is, the PLL circuits all operate with integer-N dividers.

The multi-frequency LO signal generating circuit 14 can be implemented in analog or digital technology. Advantages of a digital PLL circuit include the absence of large area capacitors in the analog loop filter, and the possibility to support advanced digital algorithms, such as to implement high-speed frequency hops. On the other hand, advantages of an analog PLL circuit include reduced design complexity and excellent phase noise. As one example of the design trade-offs, the simplicity of an analog PLL circuit makes it an excellent choice at very high frequencies or for very low power. However, this choice sacrifices the possibility for digital algorithms to achieve improved performance. Disclosed and claimed herein are embodiments of the present invention optimized for implementation in both analog and digital technology.

In either embodiment, the multi-frequency LO signal generating circuit 14 phase-locks together a plurality of PLL circuits using signals at the reference frequency. It is then possible to compare the phase deviations of different PLL circuits, even though they generate LO signals at different frequencies, as the reference signals are at the same frequency. Accordingly, the phases of the different LO signals, when frequency divided to (or sampled at) the reference frequency, will have a constant relation when all PLL circuits in the plurality are phase-locked and stable at various integer multiples of the reference frequency. Phase drift between PLL circuits can then be detected and corrected, notwithstanding that the PLL circuits are operating to generate different frequency LO signals.

According to embodiments of the present invention, the oscillator energy of a plurality of PLL circuits is combined to obtain a lower phase noise than that of a single PLL circuit, even though the PLL circuits operate at different frequencies. This can be achieved up to the loop bandwidth of the difference mode or local PLL loops. This represents a fundamental advance in the state of the art, compared to a multi-core PLL circuit, where the cores must operate at the same frequency to be combined so that a low phase noise can be achieved. Embodiments of the present invention thus obtain both low phase noise, and LO signals with different frequencies as needed by a multi-carrier transceiver.

Figure 2:
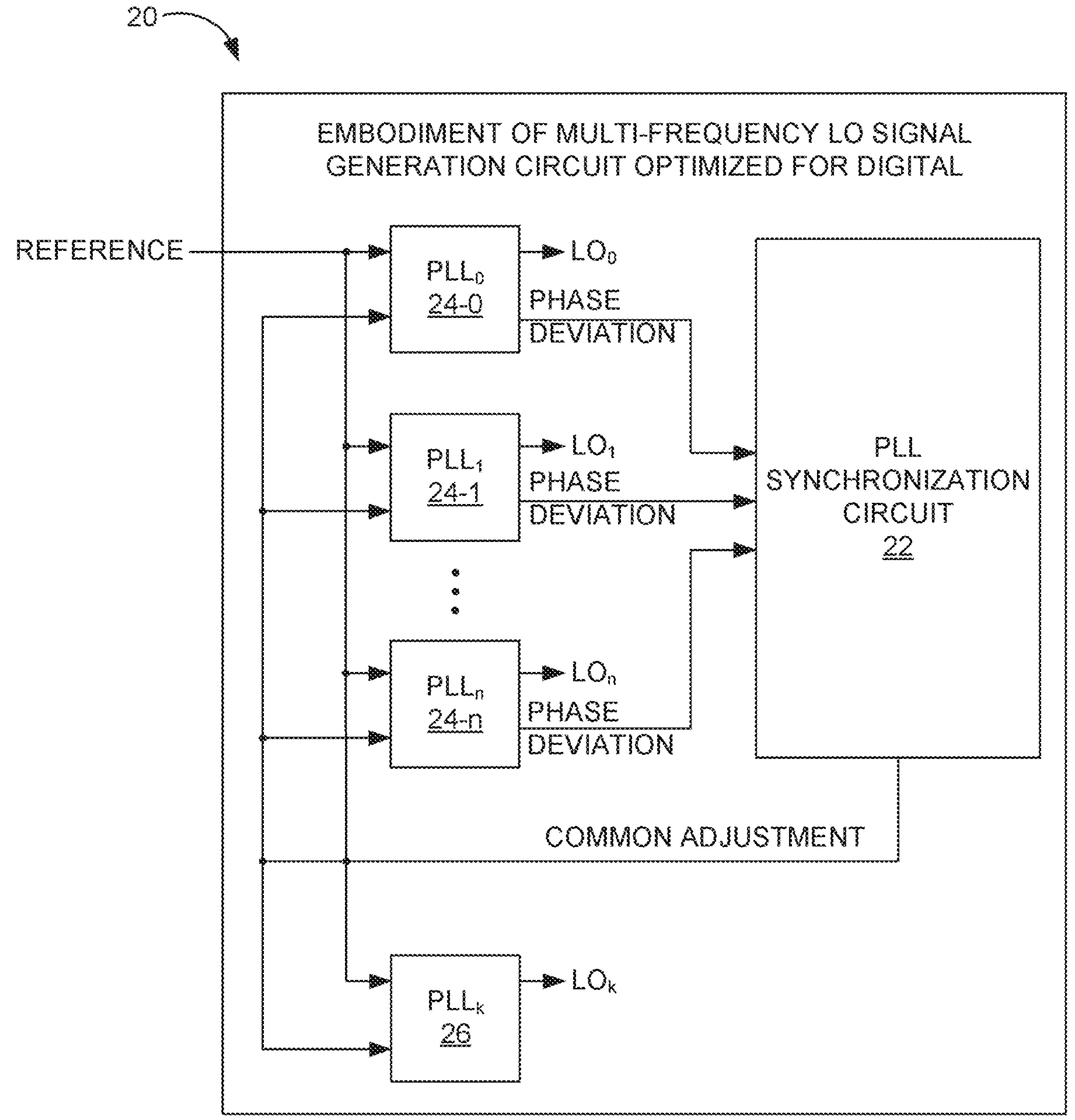
FIG. 2 is a block diagram of an embodiment of a multi-frequency LO signal generation circuit optimized for digital implementation.
Figure 3:
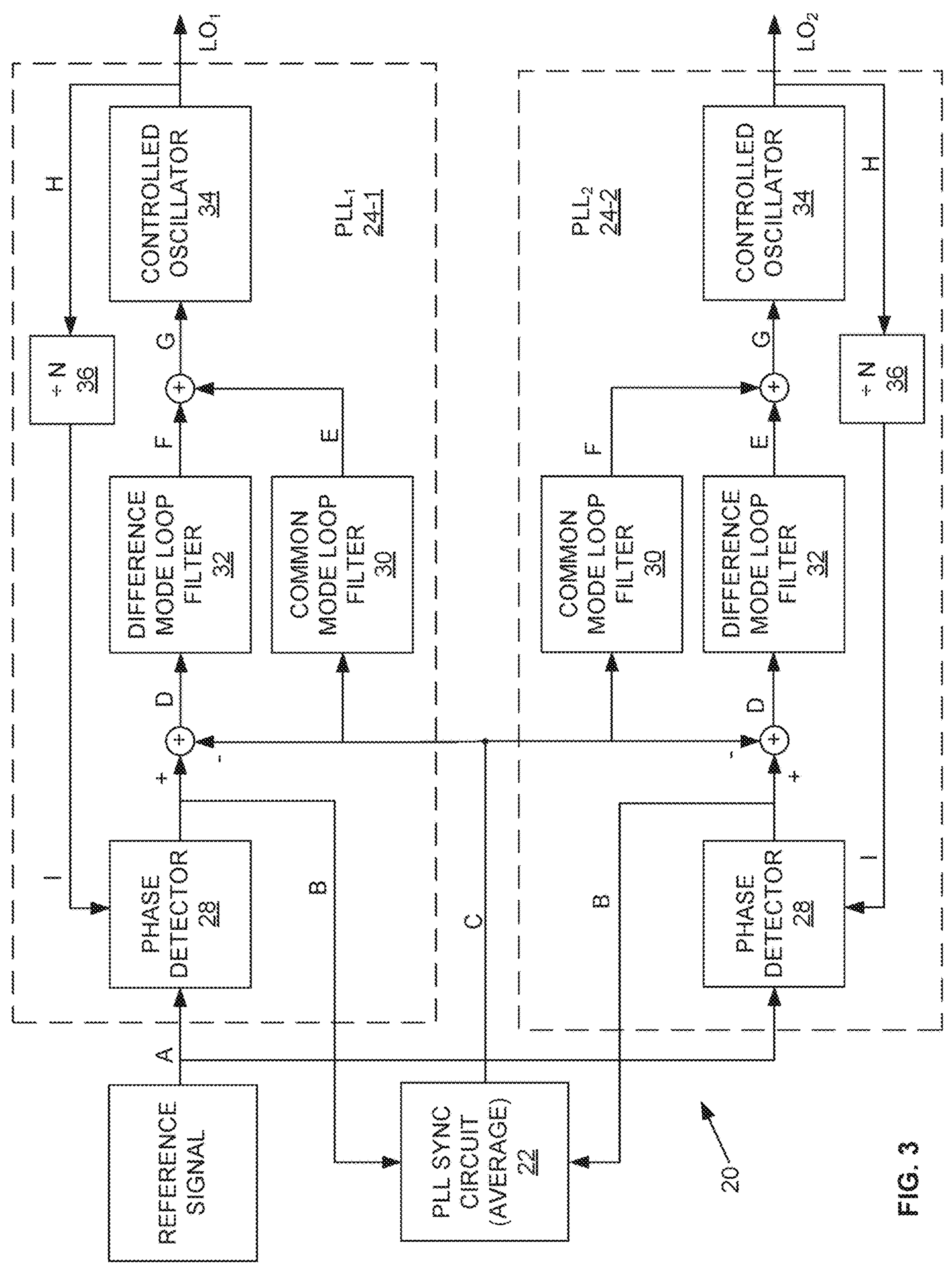
FIG. 3 is a more detailed block diagram of the embodiment of FIG. 2.
Figure 4:
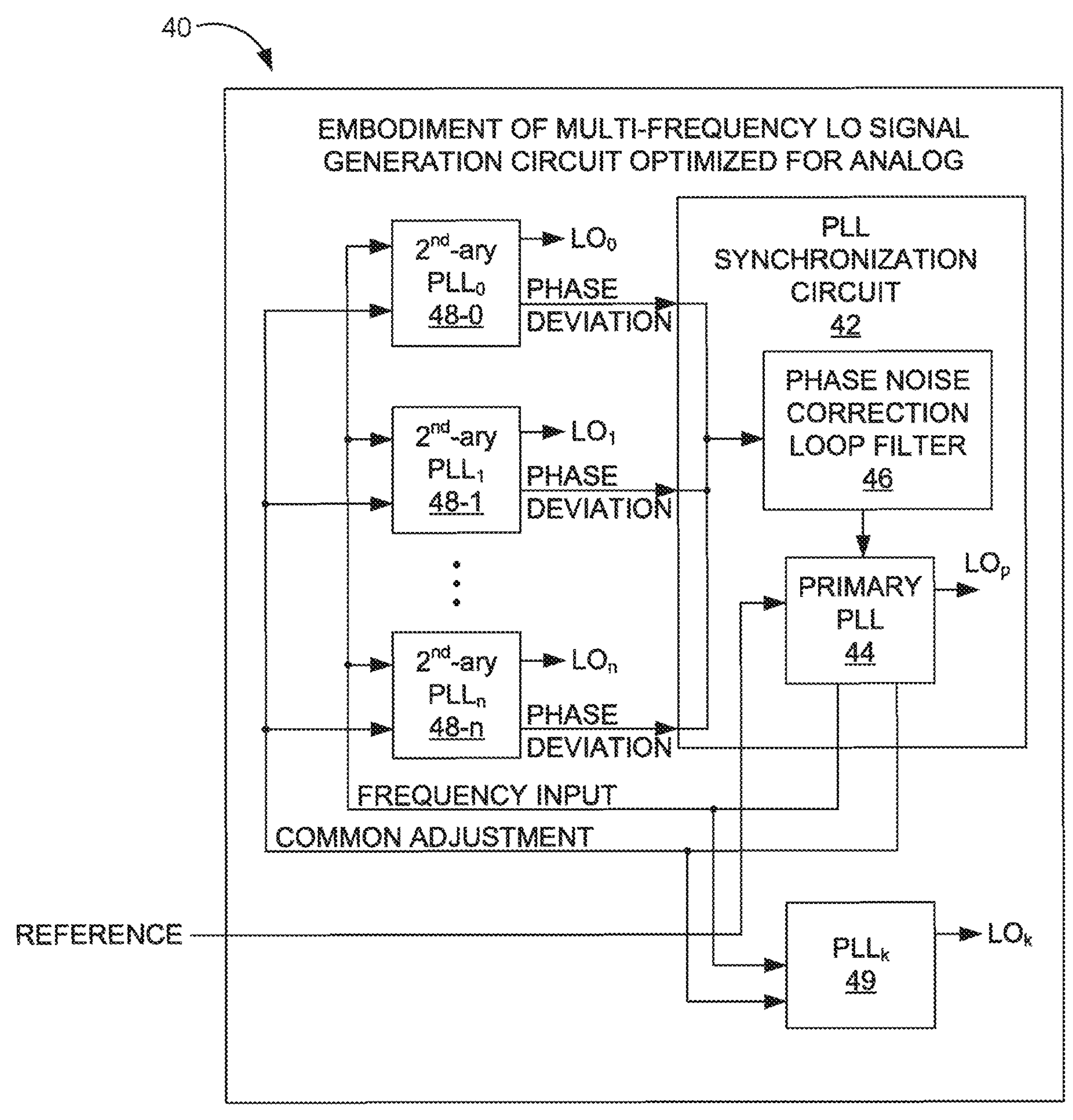
FIG. 4 is a block diagram of an embodiment of a multi-frequency LO signal generation circuit optimized for analog implementation.

FIGS. 2 and 4 depict the basic structure of the multi-frequency LO signal generation circuit 14, in embodiments optimized for implementation by digital and analog circuits, respectively. The detailed operation of the cooperative phase-locking operation for each embodiment is explained in greater detail below, with reference to FIGS. 3 and 5. Both embodiments comprise a system receiving a single reference frequency input, and outputting a plurality of LO signals. At least some of the LO signals are at different frequencies, and they are on a frequency grid having a granularity of the reference frequency input. That is, the PLL circuits all employ integer-N dividers, and generate LO signals that are (different) integer multiples of the reference frequency.

In both embodiments, a plurality of PLL circuits is phase-locked together by mutual operation, enabled by a PLL synchronization circuit. A brief, high-level view of this operation is provided with reference to FIGS. 2 and 4, and detailed descriptions of each embodiment are provided with reference to FIGS. 3 and 5.

Each of the plurality of phase-locked PLL circuits outputs a phase deviation signal to the PLL synchronization circuit. The phase deviation signals are each derived from a phase or phase-frequency detector in the PLL circuit, and are indicative of a local phase error. The PLL synchronization circuit processes or utilizes the phase deviation signals, and outputs a common adjustment signal to all PLL circuits. The PLL synchronization circuit synchronizes operation of the plurality of PLL circuits such that they lock together with wide bandwidth, and mitigate propagation of high frequency reference signal noise to the LO signals.

FIG. 2 depicts an embodiment 20 of the multi-frequency LO signal generation circuit 14 that is optimized for implementation by digital PLL circuits. It includes a PLL synchronization circuit 22, a plurality of phase-synchronized PLL circuits 24-0, 24-1, . . . , **24-*n*, and in some embodiments, a PLL circuit 26 that is not part of the plurality 24, since it does not provide a phase deviation signal to the PLL synchronization circuit. In this embodiment 20, all PLL circuits 24, 26 receive the reference signal as a reference frequency input. As explained in greater detail below, each of the PLL circuits 24, 26 includes two loop filters. Each of a plurality of PLL circuits 24 outputs a phase deviation signal, which in this embodiment 20 is a digital value of the local phase error. The PLL synchronization circuit 22 receives the phase deviation signals and processes them; in this embodiment 20, it averages them. The PLL synchronization circuit 22 outputs a common adjustment signal that, in this embodiment 20, is a digital value of the average phase error of the plurality of PLL circuits 24. Each PLL circuit 24, 26 generates oscillator control inputs from both a common mode loop and a difference mode loops. The common mode loop forces all PLL circuits in the plurality 24 to track the phase of the reference signal, and the difference mode loop minimizes any spread, or variation, in phase among the LO signal outputs of the PLL circuits 24, 26, although they may be at different frequencies. A PLL circuit 26 may operate at a frequency near a transmitter, and be subject to frequency pulling. Accordingly, the PLL circuit 26 does not output a phase deviation signal to the PLL synchronization circuit (22), so the frequency pulling at the PLL circuit 26 does not propagate to the plurality of PLL circuits 24**.

FIG. 3 is a detailed diagram showing the structure and operation of two of the plurality of PLL circuits 24-1, 24-2 in the embodiment of the multi-frequency LO signal generation circuit 20 that is optimized for implementation by digital PLL circuits. The two PLL circuits 24-1, 24-2 each receive the reference signal A. The two PLL circuits 24 output their local phase errors as phase deviation signals B to the PLL synchronization circuit 22. The PLL synchronization circuit 22 computes the average phase error of the plurality of PLL circuits 24, and returns that value, as the common adjustment signal C, to each PLL circuit 24.

Each PLL circuit 24-1, 24-2 comprises a phase detector 28 (may in some PLL architectures be a phase/frequency detector, PFD), a common mode loop filter 30, a difference mode loop filter 32, a Controlled Oscillator (CO) 34, and an integer divider 36. Each PLL circuit 24-1, 24-2 operates conventionally, except that it has two loop filters 30, 32, the outputs of which combine to form the CO 34 control input.

The CO 34, which may for example comprise a Digital Controlled Oscillator (DCO), generates a periodic output signal $LO_n$ (labeled H in FIG. 3) in response to a CO control input G. The frequency of the output signal H is divided by an integer value by the divider circuit 36, which may be a different integer value in the two PLL circuits 24-1, 24-2. Hence the output LO signals may have different frequencies; however, the divided output signals I are at the same frequency (that of the reference signal A). The phase detector 28 compares the divided output signal I to the reference signal, and outputs a phase error signal B indicating a phase error between the two. The common mode loop filter 30 and difference mode loop filter 32 operate as described further herein, each generating a CO control signal E, F. These CO control signals E, F are combined to generate a CO control input G, which controls the operation of the CO 34, locking it to frequency that is an integer multiple of the reference signal A frequency, and phase locked to the reference signal A.

In one embodiment, the reference signal A is at a higher frequency than typically input to PLL circuits, for example from 100 MHz to 4 GHZ, to allow a high bandwidth in the difference mode loops 32. This provides superior rejection of undesired interaction between oscillators 34 due to coupling, and it suppresses uncorrelated noise between oscillators 34 up to a higher frequency offset. At offset frequencies where the difference mode loop gain is high, the PLL circuits 24-1, 24-2 will lock to a common mode and then behave as a single PLL circuit (albeit outputting different frequency LO signals) with the phase noise improved by 10.log(N) dB compared to a single PLL circuit, where N is the number of participating PLL circuits 24-1, 24-2.

As mentioned above, the phase detector 28 in each PLL circuit 24-1, 24-2 compares that PLL circuit's divided output signal I to the reference signal A, and outputs a local phase error as the phase deviation signal B. One comparison is performed at each reference signal period, so if the reference signal A is for example 200 MHZ, a data stream of 200 million samples per second is generated by each phase detector 28. By representing the phase deviation signal B in digital form, which is common in digital PLL circuits 24, if bit errors are avoided the data can be transported across the IC without signal degradation. For further signal integrity, the phase deviation signal B, and the common adjustment signal C (the average phase error) transferred back to the PLL circuits 24, could be transmitted with a parity bit or other error detection/correction, as known in the art, so long as the processing does not introduce significant delay. The phase deviation signals B from the phase detectors 28 in each of the plurality of PLL circuits 24-1, 24-2 are transferred to the PLL synchronization circuit 22, which calculates the average phase error and outputs it as the common adjustment signal C. This calculation is straightforward to implement, and can be performed with low power. For example, the phase error signals B from all participating phase detectors 28 are added together, and then the result is divided by the number of participating PLL circuits 24-1, 24-2 (N). If N is equal to a power of 2, say $N=2^M$, the division is particularly simple, and is performed by shifting by M bit positions to the right.

The common adjustment signal C is used by both the common mode loop filter 30 and the difference mode loop filter 32 in each PLL circuit 24-1, 24-2. The common mode loop filter 30 operates using only the common adjustment signal C as input. The common mode loop filter 30 includes an integrator to achieve high low-frequency gain. The common mode loop filter 30 causes the average phase of all of the plurality of PLL circuit 24 outputs to closely track the phase of the reference signal A. Where this is implemented as a digital filter, the integrator can be made ideal, with a pole at DC. The common mode loop filter 30 also has more transfer poles and zeros to shape the response and ensure stability. In each of the plurality of PLL circuits 24, the output E of the common mode loop filter 30 is (through a summation) input to the digitally controlled oscillator (DCO) 34. The output of the DCO 34 is then fed back, through the integer-N divider 36, to the phase detector 28, closing the feedback loop. The bandwidth of this loop is chosen rather low, so that the reference noise contribution at the outputs is minimized. This will occur by setting the bandwidth equal to the offset frequency where the equivalent reference noise at the output equals the phase noise of the combined oscillators 34, i.e., the noise of a single DCO 34 minus 10.log(N), where N is the number of DCOs 34 in the plurality of PLL circuits 24. The common mode loop filter 30 ensures that the frequency accuracy of the reference signal A is achieved by all output signals H. However, the reference noise is not tracked to a higher frequency than necessary, and the common mode loop filter bandwidth is only wide enough for the DCOs 34 to provide sufficiently low common mode phase noise at and above the common mode loop bandwidth.

The difference mode loop filter 32 operates using the difference D between the average phase error C (the common adjustment signal) and the PLL circuit's local phase error B (the phase deviation signal). This pulls each PLL circuit's phase to align with the common phase of the plurality of PLL circuits 24. The difference mode loop filter 32 is designed to have as wide a bandwidth as possible. Common practice for PLL bandwidth is not to exceed about 1/10 of the reference frequency, which is a reasonable guideline. For example, if the reference frequency is 200 MHz, the bandwidth of the difference mode loop would be about 20 MHz. Up to that frequency, phase differences between the Controlled Oscillators 34 in different PLL circuits 24-1, 24-2 are suppressed. In particular, their uncorrelated phase noise is suppressed.

Hence, the two loop filters 30, 32 act together to cause all of the plurality of PLL circuits 24 to track the phase of the common reference signal A. The common mode loop filter 30 forces the plurality of PLL circuits 24 to track the reference, but there will be a spread, or variation, in phase among the outputs of the PLL circuits 24-1, 24-2. The difference mode loop filter 34 operates to minimize that spread, causing all of the plurality of PLL circuits 24 to effectively operate as a single PLL circuit in terms of phase, albeit with different frequency LO signal outputs.

As discussed with respect to FIG. 2, a PLL circuit k 26 may operate at a frequency close to that of a transmitter. To prevent frequency pulling of the PLL circuit k 26 from affecting the entire system, the PLL circuit k 26 does not provide its phase deviation signal to the PLL synchronization circuit (22). For example, the PLL circuit k 26 may simply not output a phase deviation signal to the PLL synchronization circuit 22. Alternatively, the PLL synchronization circuit 22 may exclude the phase deviation signal from the PLL circuit k 26 when calculating the average phase deviation, which is output as the common adjustment signal. Of course, when excluding one or more PLL circuits from this calculation, the PLL synchronization circuit 22 must adjust its divisor to the number of PLL circuits 24 for which the average is calculated. Other mitigation measures for the PLL circuit k 26 may include increasing its loop bandwidth, and/or operating the PLL circuit k 26 at a different frequency (e.g., 2$x$), and dividing its output (e.g., by 2) to obtain the desired frequency LO signal.

FIG. 4 depicts an embodiment 40 of the multi-frequency LO signal generation circuit 14 that is optimized for implementation by analog PLL circuits. It includes a PLL synchronization circuit 42, a plurality of secondary PLL circuits 48-0, 48-1, . . . , **48-*n*, and in some embodiments, a PLL circuit 49 that is not part of the plurality 48, since it does not provide a phase deviation signal to the PLL synchronization circuit 42. In this embodiment 40, the PLL synchronization circuit 42 includes a primary PLL circuit 44 and a phase noise correction loop filter 46. Note that in this embodiment 40, the plurality of secondary PLL circuits 48 and the independent PLL circuit 49 do not receive the reference signal, but rather a frequency input signal generated by the primary PLL circuit 44 in the PLL synchronization circuit 42. This signal is the divided output signal of the primary PLL circuit 44**, and it is at the reference signal frequency.

As explained in greater detail below, each of the plurality of secondary PLL circuits 48 includes two charge pumps. One charge pump operates conventionally, converting signal pulses from a phase frequency detector into current pulses that are passed to a loop filter. A second charge pump operates similarly, but inverts the current polarity and outputs it to the PLL synchronization circuit 42 as the phase deviation signal. In this embodiment 40, the phase deviation signals are summed in the PLL synchronization circuit 42 by connecting the individual phase deviation signals to a single node, thus summing their individual currents to a combined current signal. Those of skill in the art will readily recognize that the individual phase deviation signals may be connected to a combined phase deviation signal at the output of each secondary PLL circuit 48, and the combined phase deviation signal routed to the PLL synchronization circuit 42. The combined currents of the phase deviation signals are input to a phase noise correction loop filter 46, which generates a control input for a controlled oscillator in the primary PLL circuit 44. The PLL synchronization circuit 42 outputs a common adjustment signal to all of the PLL circuits 48, 49, which in this embodiment 40 is a control input to their oscillators. A PLL circuit 49 may operate at a frequency near a transmitter, and be subject to frequency pulling. Accordingly, the PLL circuit 49 is not part of the plurality of secondary PLL circuits 48 that output a phase deviation signal to the PLL synchronization circuit 42, so the frequency pulling at the PLL circuit 49 does not propagate to the plurality of PLL circuits 48.

Figure 5:
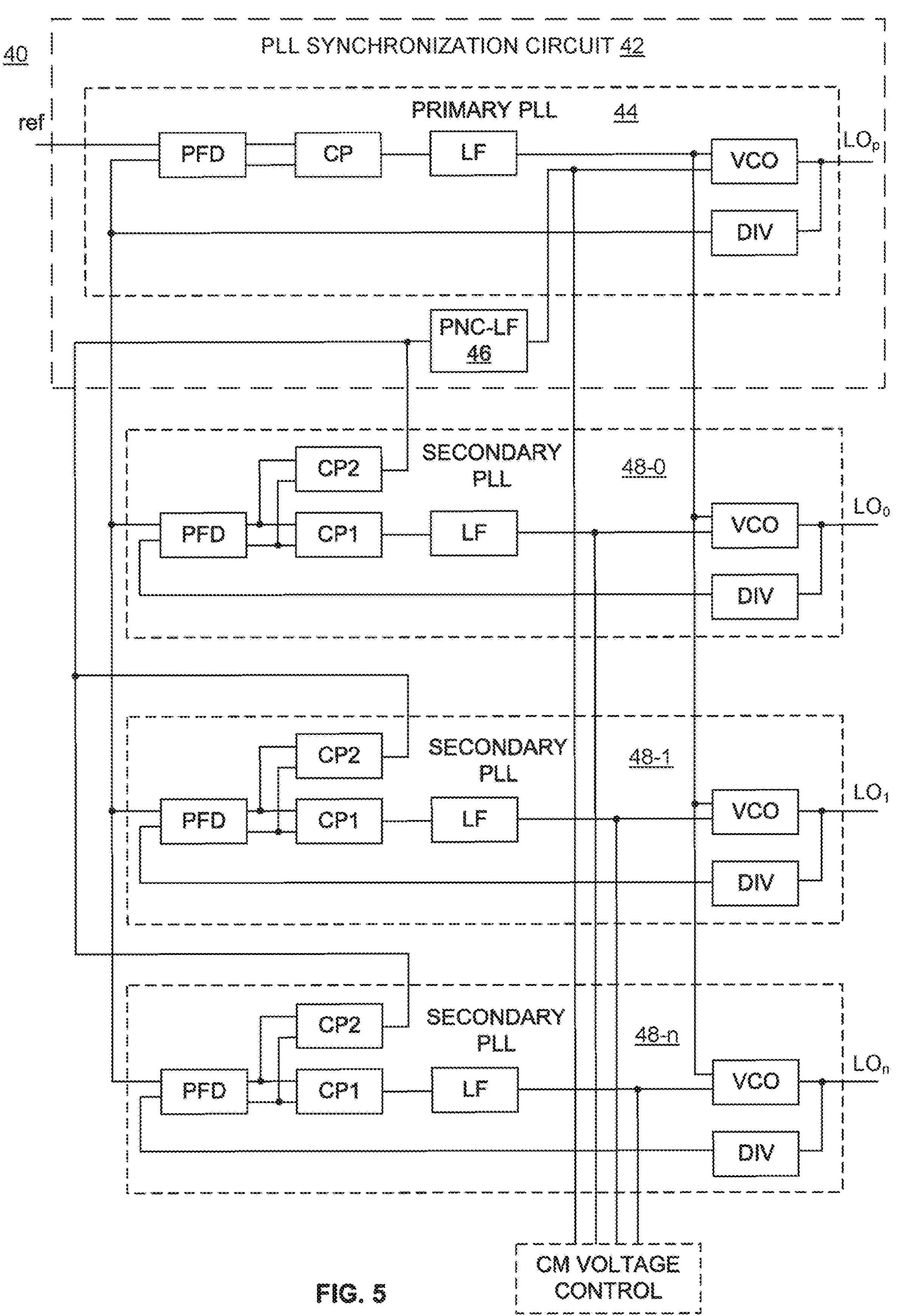
FIG. 5 is a more detailed block diagram of the embodiment of FIG. 4.

FIG. 5 is a detailed diagram showing the structure and operation of the embodiment of the multi-frequency LO signal generation circuit 40 optimized for analog implementation. FIG. 5 depicts a PLL synchronization circuit 42, a plurality of secondary PLL circuits 48, and a Common Mode (CM) voltage control circuit. The PLL synchronization circuit 42 includes a primary PLL circuit 44 and a phase noise cancellation loop filter (PNC-LF) 46.

Those of skill in the art will note at least two structural differences between the PLL circuits of FIG. 5 and conventional PLL circuits. First, the Voltage Controlled Oscillators (VCOs) have both a primary and an auxiliary control input. Second, the plurality of secondary PLL circuits 48 includes both first and second Charge Pumps (CP1, CP2). The structure and operation of both features are explained herein.

The primary PLL circuit 44 operates largely conventionally (other than the auxiliary control input to the VCO, which is described below). The primary PLL circuit 44 receives the periodic reference signal (ref). The output of the VCO is divided by an integer divider circuit (DIV), to provide a divided periodic signal at the reference signal frequency. The phase and frequency of the divided output signal are compared to that of the reference signal in a Phase/Frequency Detector (PFD), which outputs, in the alternative, Charge Up or Charge Down pulses in response to one of the inputs leading or lagging the other. A Charge Pump (CP) generates a positive or negative current in response to the CU/CD pulses. A loop filter (LF) converts the CP output current to a voltage signal, which is output as the primary VCO control input. In response to changes in the primary VCO control input, the VCO increases or decreases the frequency of its LO signal output such that it remains an integer multiple of the reference signal. The conventional analog charge-pump PLL circuit is well known in the art and exhibits proven performance and robustness.

In this embodiment of the multi-frequency LO signal generation circuit 40, the primary PLL circuit 44 outputs its primary VCO control input. This signal is output by the PLL synchronization circuit 42 to the plurality of secondary PLL circuits 48 as the common adjustment signal. At each secondary PLL circuit 48-0, 48-1, 48-2, the common adjustment signal is the primary VCO control input. Accordingly, the plurality of PLL circuits 48 track the phase of the primary PLL circuit 44. However, in real-world implementations there will inevitably be some mismatches between the oscillators, resulting in phase drift. This is compensated for by the secondary PLL circuit 48 control loops, which force the phase of each secondary PLL circuit 48 LO signal to lock to that of the primary PLL circuit 44.

The bandwidth of the primary PLL circuit 44 is preferably set for best phase noise performance. A larger bandwidth causes increased output noise from the reference signal and in-band PLL noise sources, whereas a lower bandwidth causes increased output noise due to the VCO. Accordingly, there is an optimum bandwidth for phase noise. This bandwidth is typically rather limited, and a multi-frequency LO generating circuit 40 with all loops limited to this bandwidth would not be effective in suppressing deleterious interactions due to coupling between the oscillators. To compensate, the control loops in the plurality of secondary PLL circuits 48 can have larger bandwidth than the primary PLL circuit 44, and to reduce the impact of reference signal noise at increased bandwidth they are structured to lock to the phase of the primary PLL circuit 44, rather than directly to the phase of the reference signal.

Each of the plurality of secondary PLL circuits 48 includes a VCO configured to generate an LO signal at an integer multiple of its frequency input signal, which matches the frequency of the reference signal. Each secondary PLL circuit 48 also includes an integer divider circuit configured to generate a local divided LO signal. The divider value may differ from that of the primary PLL circuit 44 and other secondary PLL circuits 48. At the PFD, each secondary PLL circuit 48 compares its local divided LO signal to the divided output signal received from the primary PLL circuit 44. According to the well-known operation of an analog PLL circuit, if one of these PFD inputs leads or lags the other in phase, the PFD outputs, in the alternative, Charge Up (CU) or Charge Down (CD) pulses, the lengths of which are proportional to the PFD input signals' phase mismatch. A first Charge Pump (CP1) generates a positive or negative current in response to the CU/CD pulses, and a Loop Filter (LF) converts the CP current into a VCO control voltage. This control voltage is the auxiliary VCO control input.

Both the common adjustment signal received from the PLL synchronization circuit 42, and the control loop of each secondary PLL circuit 48, drive each secondary PLL circuit 48 to track the phase of the primary PLL circuit 44.

The bandwidth of phase control loops in the secondary PLL circuits 48 can be made much higher than of the control loop of the primary PLL circuit 44, because the reference signal is not present. In place of the reference signal, the divided LO signal of the primary PLL circuit 44 is used a frequency input signal, which has less high frequency phase noise than the reference signal, due to lowpass filtering of the primary PLL circuit 44 loop.

The VCO of the primary PLL circuit 44 may introduce phase deviations, referred to herein as phase noise. This will be sensed by the secondary PLL circuits 48, which include a second Charge Pump (CP2) to generate phase deviation signals— in this embodiment 40, the phase deviation signals are current signals. Because each secondary PLL circuit 48, being locked to the primary PLL circuit 44, would normally drive its VCO to follow the primary PLL circuit 44— that is, to propagate the phase noise— to counteract the phase noise, the phase deviation current output by CP2 has a polarity opposite to the current output by CP1. The phase deviation current is also scaled down, in one embodiment, by a factor related to the number of secondary PLL circuits 48. For example, if there are N secondary PLL circuits 48 in the plurality, each may scale its phase deviation CP2 current by 1/N (compared to the CP1 current), to provide an effective current to counter deviations in the VCO of the primary PLL circuit 44, resulting in the same loop bandwidth as for the secondary PLL circuit 48 VCO deviations (assuming the loop filters in the secondary PLL circuits 48 to have the same impedance as the PNC-LF 46, and the relative tuning sensitivity of the second control input to be the same in the primary PLL circuit 44 VCO as in the secondary PLL circuit 48 VCOs).

The phase deviation currents are summed together (for example, by connecting all CP2 outputs), and the resulting combined phase deviation current is input to the Phase Noise Correction Loop Filter (PNC-LF) 46. The PNC-LF 46 converts the combined phase deviation current into a voltage, and outputs it to the primary PLL circuit 44 for use as the auxiliary VCO control input. In this manner, phase noise caused by the VCO of the primary PLL circuit 44 is detected and counteracted by the secondary PLL circuits 48.

As an alternative to each secondary PLL circuit 48 scaling its phase deviation current (e.g., by 1/N), PNC-LF 46 can be scaled in impedance by 1/N. Preferably, the loop gain of the phase deviation loop is the same as for the phase control loops of the secondary PLL circuits 48. Where N paths work in parallel, either CP2 current or PNC-LF 46 impedance should be scaled by 1/N, compared to the CP1 current and secondary PLL circuit 48 LF impedance, respectively. Alternatively, both can be scaled, by various combinations of values resulting in an overall scaling of 1/N. The proper scaling to achieve the desired loop gain, and which circuits to scale, are implementation details that can be derived, for a given implementation, by those of skill in the art, without undue experimentation, given the teachings of the present disclosure.

A Common Mode (CM) voltage control circuit monitors the auxiliary VCO control voltages, averages them, and compares the average to a CM target value or interval. This prevents the secondary PLL auxiliary VCO control input levels from going out of bounds, as the phase control loops could then stop working properly. Details of a CM voltage control circuit are found in the above-incorporated PCT patent application PCT/EP2021/058001.

As mentioned above, if a PLL circuit is at risk of frequency pulling by a nearby (in frequency) transmitter circuit, it can be removed from the plurality of PLL circuits 48 cooperatively participating in phase noise mitigation. In particular, in the embodiment 40 of FIG. 4, the PLL circuit k 49 does not output a correction current from CP2 to the PHC-LF 46. For example, the CP2 current is simply turned off. The pulling at the affected PLL circuit k 49 will then not affect the primary PLL circuit 44 phase, which prevents pulling of the full system. Note that the CP2 current output by the remaining secondary PLL circuits 48 should then be increased to maintain the same total CP2 current, to keep the phase noise correction transfer function of the secondary PLL circuits 48 close to optimum. For example, if there were four secondary PLL circuits 48, and the CP2 output of one is turned off, the CP2 current output by each remaining PLL circuit should be increased by a factor of 4/3.

Other mitigation measures for the PLL circuit k 49 may include increasing its loop bandwidth, and/or operating the PLL circuit k 49 at a different frequency (e.g., 2*x*), and dividing its output (e.g., by 2) to obtain the desired frequency LO signal.

In one embodiment, to increase flexibility of the system, and allow for a greater variety of frequency grid plans to match LO signal frequencies with the carriers desired to be processed, the reference frequency input is generated by a high resolution fractional-N PLL circuit. The output of this PLL circuit can be tuned to a specific desired reference frequency, and all LO signals are then generated as integer multiples of this reference frequency. In a system with 64 antenna elements and four carriers there may as an example be 16 multi-carrier transceiver ICs with 4 PLLs in each, i.e., a total of 64 integer-N PLLs in the system. Accordingly, the complexity and power consumption of a single fractional-N PLL does not significantly impact that of the complete system. However, the flexibility gained can be substantial, allowing a much better fit of the LO signals to the carriers to be processed.

Even using a programmable reference frequency, however, it is inevitable that some carriers will not be centered around an available LO frequency. For more accurate analog channel filtering, complex bandpass filters are then used.

Figure 6:
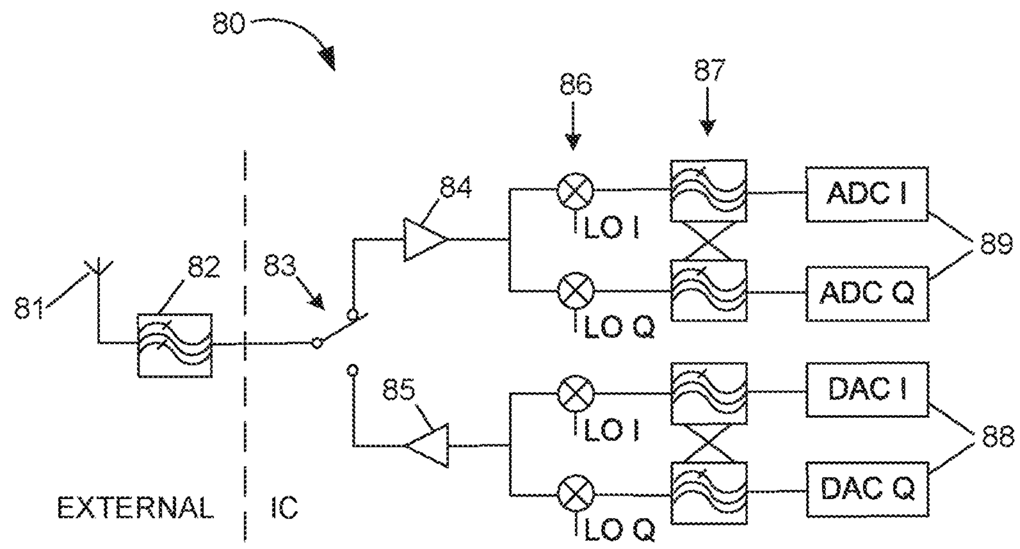
FIG. 6 is a block diagram of a transceiver chain.

FIG. 6 depicts one example of a transceiver chain using a single frequency conversion and a complex mixer stage. Signals to and from an antenna element 81 are externally RF filtered 82. An antenna switch 83 (e.g., a duplexer, Surface Acoustic Wave (SAW) filter, or the like) switches between Tx and Rx functionality. In both chains, a frequency conversion mixer 86 mixes the Rx or baseband signal, respectively, with quadrature LO signals. Depending on the relationship between carrier frequency and LO signal, this circuit can be operated as a homodyne or a low-IF transceiver. In some cases where the offset frequency is very low, it will be a floating border between the two. A complex channel select filter 87 is realized using known techniques, such as using two coupled low pass filters. The channel can then be accurately filtered, although not centered around the LO frequency. This reduces requirements on the data converters. The DACs 88 and ADCs 89 must be able to process at least the frequency range of the carrier signal, and in practice a larger range to handle aliasing, since the analog filter has limited suppression. To support transmitter predistortion, the channel filter in the Tx may have to use a wider bandwidth, covering also adjacent channels, and the DAC then needs a higher bandwidth as well.

Although FIG. 6 depicts a single conversion stage, embodiments of the present invention are not limited to this implementation. In one embodiment (not shown), a sliding IF technique is used, with LO signals derived from a single oscillator. In another embodiment (not shown), switches are introduced, and LO signals in different mixer stages are provided by different PLL circuits. Although this embodiment increases the cost and complexity due to high frequency routing and switches, it provides increased flexibility to cover more carrier frequencies, with fewer PLL circuits.

In some embodiments, the periodic signal output by the PLL circuits 24, 48, denoted $LO_n$ in FIGS. 2-5, is frequency-multiplied or divided prior to being applied to a mixer. For example, the PLL circuits 24, 48 may generate, e.g., 2x the desired LO frequency, and its output is divided by two.

Figure 7:
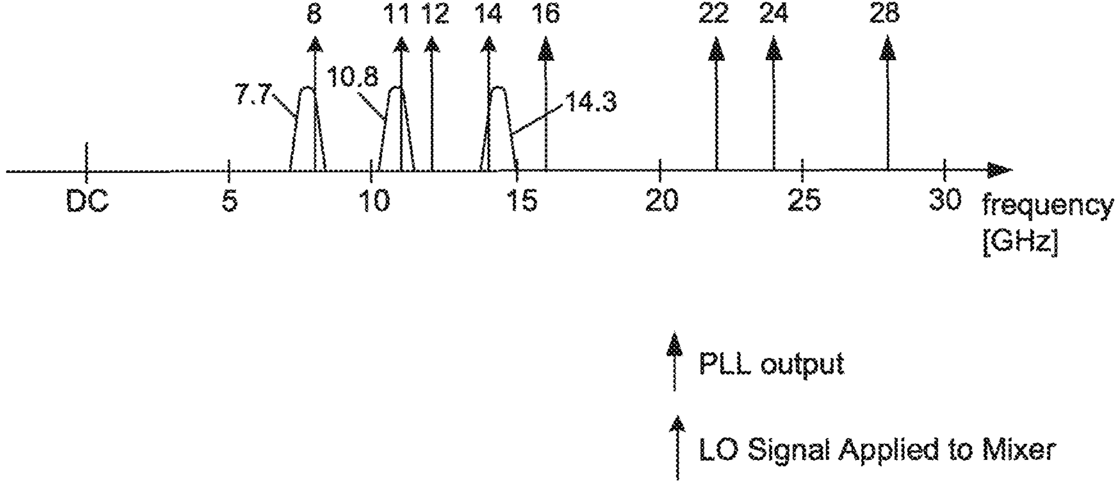
FIG. 7 is frequency domain graph showing an example of PLL circuit output frequencies, corresponding LO frequencies, and carrier signals.

FIG. 7 is a frequency graph depicting an example of such an embodiment. In this example, the reference frequency is 2 GHZ, and four PLL circuits have division numbers 8, 11, 12, and 14. These PLL circuits generate output signals at 16, 22, 24, and 28 GHz. These are divided by two, yielding the desired LO frequencies of 8, 11, 12, and 14 GHz. These fit well to carriers centered at 7.7, 10.8, and 14.3 GHZ.

Figure 8:
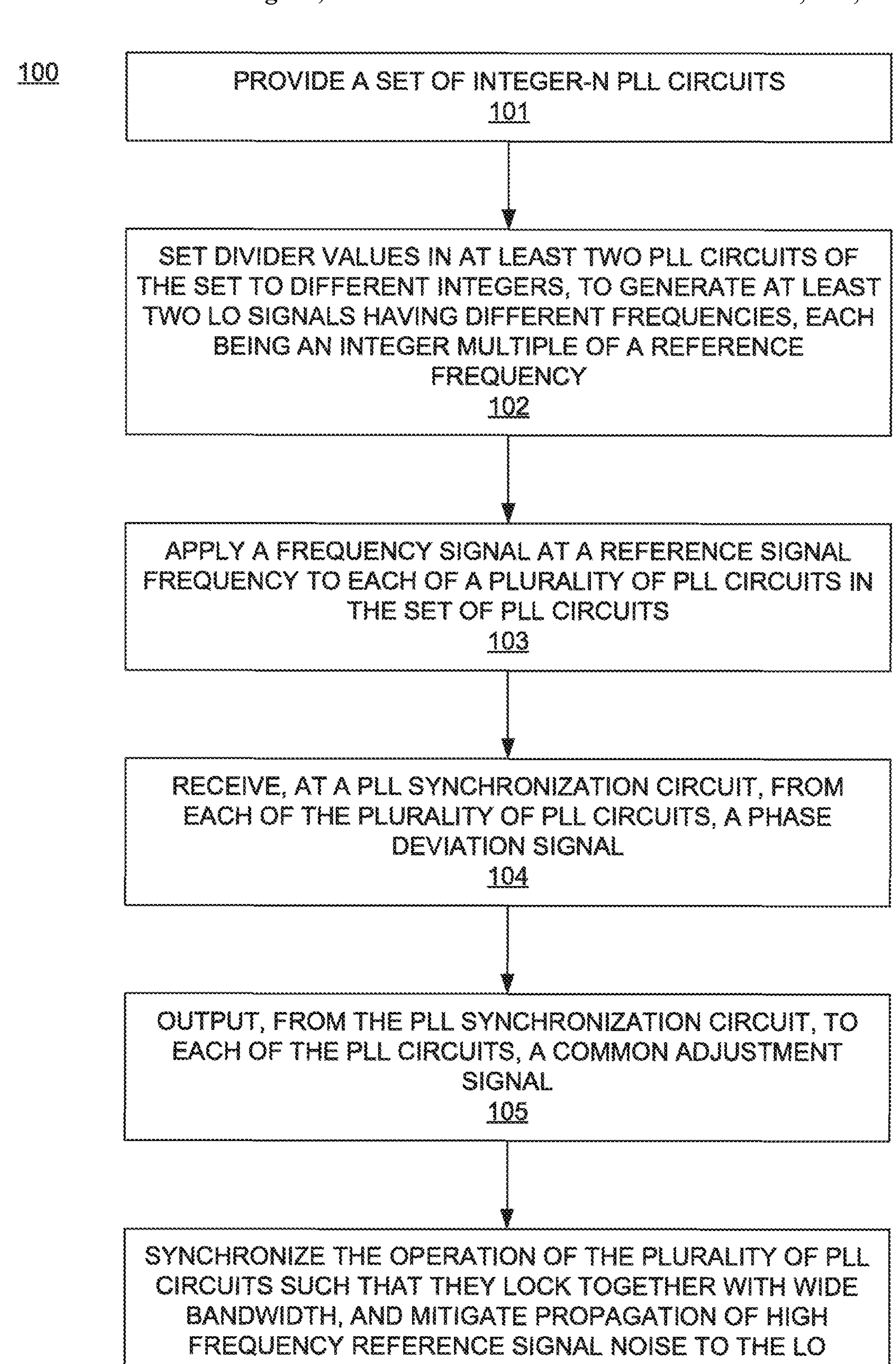
FIG. 8 is a flow diagram of a method of generating a set of periodic signals at different frequencies.

FIG. 8 depicts the steps in a method 100 of generating a set of periodic LO signals at different frequencies. A set of integer-N PLL circuits 24, 26, 44, 48, 49 is provided (block 101). Divider values in at least two PLL circuits 24, 26, 44, 48, 49 of the set are set to different integers, to generate at least two LO signals having different frequencies (block 102). The frequency of each LO signal is an integer multiple of a reference frequency. A frequency signal at a reference signal frequency is applied to each of PLL circuit 24, 26, 44, 48, 49 in the set of PLL circuits 24, 26, 44, 48, 49 (block 103). At a PLL synchronization circuit 22, 42, a phase deviation signal is received from each of the plurality of PLL circuits 24, 48 (block 104). The PLL synchronization circuit 22, 42 outputs a common adjustment signal to each PLL circuit 24, 26, 44, 48, 49 (block 105). Operation of the plurality of PLL circuits 24, 48 is synchronized such that they lock together with wide bandwidth, and mitigate propagation of high frequency reference signal noise to the LO signals (block 106).

Figures 9A, 9B, 9C:
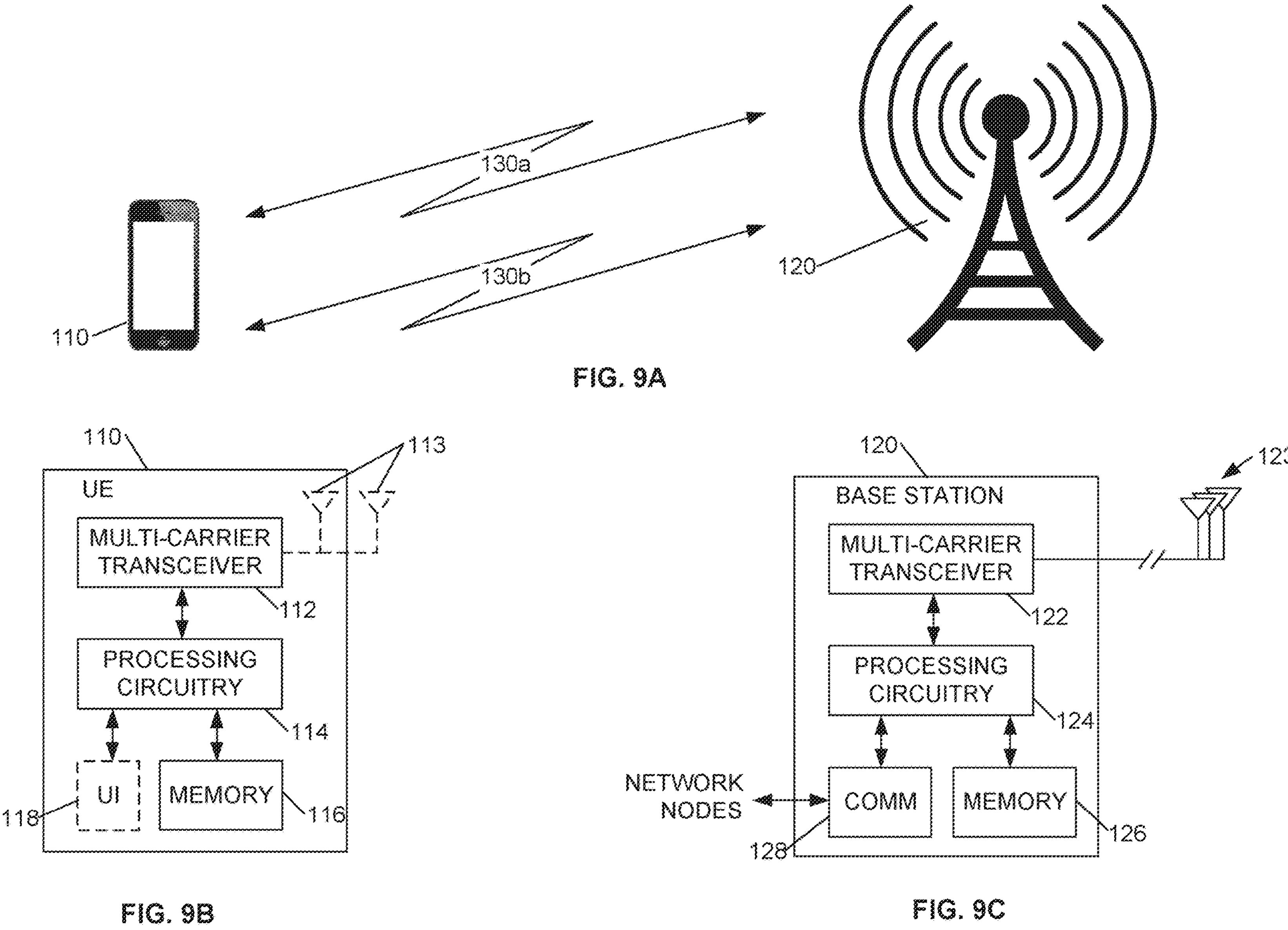
FIG. 9A is a diagram of multi-carrier transmission on the air interface of a wireless communication network.
FIG. 9B is a hardware block diagram of the UE of FIG. 9A.
FIG. 9C is a hardware block diagram of the base station of FIG. 9A.

FIG. 9A is a diagram of transmissions on multiple carriers 130*a*, 130*b* over the air interface of a wireless communication network. A User Equipment (UE) 110, such as a smartphone, receives and transmits modulated Radio Frequency (RF) signals on the two carriers 130*a*, 130*b* from and to a base station 20, such as an LTE eNB or an NR gNB. The RF signals 130*a*, 130*b* may, for example, be in the frequency range 7-15 GHz. Although only two RF signals 130*a*, 130*b* are shown, in general transmissions may occur on multiple carriers (and other UEs (not shown) may communicate on different carriers. At each of the UE 110 and base station 120, multi-carrier transceiver integrated circuit (IC) systems receive and transmit RF signals. These multi-carrier transceiver systems require multiple phase-locked Local Oscillator (LO) signals, at different frequencies, for accurate frequency conversion. Additionally, one or both of the UE 110 and base station 120 may implement beamforming, wherein the directionality of Tx or Rx antenna beams is increased and controlled, such as by controlling the phase of multiple antenna elements in a phased array antenna. The UE 110 and base station 120 may also implement MIMO techniques, such as spatial diversity and/or spatial multiplexing.

FIG. 9B is a block diagram of the UE 110 of FIG. 9A. As used herein, the term UE may refer to a user-operated telephony terminal, a machine-to-machine ($M2^M$) device, a machine-type communications (MTC) device, a Narrowband Internet of Things (NB-IoT) device (in particular a UE implementing the 3GPP standard for NB-IoT), etc. A UE 10 may also be referred to as a radio device, a radio communication device, a wireless communication device, a wireless terminal, or simply a terminal— unless the context indicates otherwise, the use of any of these terms is intended to include device-to-device UEs or devices, machine-type devices or devices capable of machine-to-machine communication, sensors equipped with a radio network device, wireless-enabled table computers, mobile terminals, smartphones, laptop-embedded equipped (LEE), laptop-mounted equipment (LME), USB dongles, wireless customer-premises equipment (CPE), and the like.

The UE 110 transmits and receives RF signals on multiple carriers on at least one antenna 113, which may be internal or external, as indicated by dashed lines. The RF signals are generated and received by one or more multi-carrier transceiver circuits 112. The multi-carrier transceiver circuit 112 includes a multi-frequency LO signal generating circuit 14, 20, 40 according to embodiments of the present invention, which is configured to generate a plurality of phase-locked LO signals at different frequencies. The multi-carrier transceiver circuits 112, as well as other components of the UE 110, are controlled by processing circuitry 114. Memory 116 operatively connected to the processing circuitry 114 stores software in the form of computer instructions operative to cause the processing circuitry 114 to execute various procedures. A user interface 118 may include output devices such as a display and speakers (and/or a wired or wireless connection to audio devices such as ear buds), and/or input devices such as buttons, a keypad, a touchscreen, and the like. As indicated by the dashed lines, the user interface 118 may not be present in all UEs 110; for example, UEs 110 designed for Machine Type Communications (MTC) such as Internet of Things (IoT) devices, may perform dedicated functions such as sensing/measuring, monitoring, meter reading, and the like, and may not have any user interface 118 features.

FIG. 9C is a block diagram of the base station 120 of FIG. 9A. A base station 120—known in various network generations as a Radio Base Station (RBS), Base Transceiver Station (BTS), Node B (NB), enhanced Node B (eNB), Next Generation Node B (gNB), or the like— is a node of a wireless communication network that implements a Radio Access Network (RAN) in a defined geographic area called a cell, by providing radio transceivers to communicate wirelessly with a plurality of UEs 110.

The base station 120 transmits and receives RF signals on multiple carriers on a plurality of antennas 123. As indicated by the broken line, the antennas 123 may be located remotely from the base station 120, such as on a tower or building. The RF signals are generated and received by one or more multi-carrier transceiver circuits 122. The multi-carrier transceiver circuit 122 includes a multi-frequency LO signal generating circuit according to embodiments of the present invention, which is configured to generate a plurality of phase-locked LO signals at different frequencies. The multi-carrier transceiver circuit 122, as well as other components of the base station 120, is controlled by processing circuitry 124. Memory 126 operatively connected to the processing circuitry 124 stores instructions operative to cause the processing circuitry 124 to execute various procedures. Although the memory 126 is depicted as being separate from the processing circuitry 124, those of skill in the art understand that the processing circuitry 124 includes internal memory, such as a cache memory or register file. Those of skill in the art additionally understand that virtualization techniques allow some functions nominally executed by the processing circuitry 124 to actually be executed by other hardware, perhaps remotely located (e.g., at a data center in the so-called "cloud"). Communication circuitry 128 provides one or more communication links to one or more other network nodes, propagating communications to and from UEs 110, from and to other network nodes or other networks, such as telephony networks or the Internet.

In all embodiments, the processing circuitry 114, 124 may comprise any sequential state machine operative to execute machine instructions stored as machine-readable computer programs in memory 116, 126, such as one or more hardware-implemented state machines (e.g., in discrete logic, FPGA, ASIC, etc.); programmable logic together with appropriate firmware; one or more stored-program, general-purpose processors, such as a microprocessor or Digital Signal Processor (DSP), together with appropriate software; or any combination of the above.

In all embodiments, the memory 116, 126 may comprise any non-transitory machine-readable media known in the art or that may be developed, including but not limited to magnetic media (e.g., floppy disc, hard disc drive, etc.), optical media (e.g., CD-ROM, DVD-ROM, etc.), solid state media (e.g., SRAM, DRAM, DDRAM, ROM, PROM, EPROM, Flash memory, solid state disc, etc.), or the like.

In all embodiments, the multi-carrier transceiver circuits 112, 122 are operative to communicate with one or more other transceivers via a Radio Access Network (RAN) according to one or more communication protocols known in the art or that may be developed, such as IEEE 802.xx, CDMA, WCDMA, GSM, LTE, UTRAN, WiMax, NB-IoT, or the like. The multi-carrier transceiver circuits 112, 122 implement transmitter and receiver functionality appropriate to the RAN links (e.g., frequency allocations and the like). The transmitter and receiver functions may share circuit components and/or software, or alternatively may be implemented separately.

In all embodiments, the communication circuitry 128 may comprise a receiver and transmitter interface used to communicate with one or more other nodes over a communication network according to one or more communication protocols known in the art or that may be developed, such as Ethernet, TCP/IP, SONET, ATM, IMS, SIP, or the like. The communication circuits 28 implement receiver and transmitter functionality appropriate to the communication network links (e.g., optical, electrical, and the like). The transmitter and receiver functions may share circuit components and/or software, or alternatively may be implemented separately.

Those skilled in the art will also appreciate that embodiments herein further include corresponding computer programs.

A computer program comprises instructions which, when executed on at least one processor of an apparatus, cause the apparatus to carry out any of the respective processing described above. A computer program in this regard may comprise one or more code modules corresponding to the means or units described above.

Embodiments further include a carrier containing such a computer program. This carrier may comprise one of an electronic signal, optical signal, radio signal, or computer readable storage medium.

In this regard, embodiments herein also include a computer program product stored on a non-transitory computer readable (storage or recording) medium and comprising instructions that, when executed by a processor of an apparatus, cause the apparatus to perform as described above.

Embodiments further include a computer program product comprising program code portions for performing the steps of any of the embodiments herein when the computer program product is executed by a computing device. This computer program product may be stored on a computer readable recording medium.

Embodiments of the present invention present numerous advantages over PLL circuits and transceivers of the prior art. By restricting LO signal frequencies to a grid having a granularity of the reference frequency, the baseband operation of all PLL circuits is compatible, and a plurality of the PLL circuit oscillators can share energy to cooperatively mitigate phase noise. In some embodiments, the frequency grid is programmable by use of a fractional-N PLL circuit to generate the reference frequency signal. Spurs in the LO signals occur at well-known and large frequency offsets (integers of the reference frequency), and their impact can thus be mitigated by RF filters in the transceivers. PLL instability due to oscillator coupling is suppressed. Oscillators at risk of frequency pulling by transmitters can be isolated from the plurality of PLL circuits participating in the phase noise mitigation, so that the pulling does not affect the entire system. These PLL circuits can be further immunized from pulling by increasing their loop bandwidth, and/or operating them at multiples of the desired frequency, combined with dividers at their outputs. Embodiments of the present invention enable ADCs and DACs to be narrow band and to operate at a lower signal frequencies, compared to a solution covering the full frequency range without frequency conversion; these blocks are very important to transceiver power consumption and dynamic range. To provide flexibility in carrier frequencies, the carriers are offset from the LO frequency grid by digital up/down-conversion of signals to/from the data converters. In the analog part, complex channel select filters are then used. The multi-frequency LO signal generation system supports different frequency plans, with both single and double frequency conversion in the transceivers. In some embodiments, the frequency plan also employs frequency multipliers or dividers after the PLL circuits to generate the LO signals applied to the mixers.

Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. The steps of any methods disclosed herein do not have to be performed in the exact order disclosed, unless a step is explicitly described as following or preceding another step and/or where it is implicit that a step must follow or precede another step. Any feature of any of the embodiments disclosed herein may be applied to any other embodiment, wherever appropriate. Likewise, any advantage of any of the embodiments may apply to any other embodiments, and vice versa. Other objectives, features, and advantages of the enclosed embodiments will be apparent from the description.

The term unit may have conventional meaning in the field of electronics, electrical devices and/or electronic devices and may include, for example, electrical and/or electronic circuitry, devices, modules, processors, memories, logic solid state and/or discrete devices, computer programs or instructions for carrying out respective tasks, procedures, computations, outputs, and/or displaying functions, and so on, as such as those that are described herein. As used herein, the term "configured to" means set up, organized, adapted, or arranged to operate in a particular way; the term is synonymous with "designed to." As used herein, the term "substantially" means nearly or essentially, but not necessarily completely; the term encompasses and accounts for mechanical or component value tolerances, measurement error, random variation, and similar sources of imprecision.

Some of the embodiments contemplated herein are described more fully with reference to the accompanying drawings. Other embodiments, however, are contained within the scope of the subject matter disclosed herein. The disclosed subject matter should not be construed as limited to only the embodiments set forth herein; rather, these embodiments are provided by way of example to convey the scope of the subject matter to those skilled in the art.

The invention claimed is:

1. A multi-frequency Local Oscillator (LO) signal generating circuit, configured to receive one periodic reference signal and to generate and output a set of LO signals, comprising:

a set of Phase Locked Loop (PLL) circuits, each configured to receive a frequency input signal at the reference signal frequency and a common adjustment signal, and output an LO signal, wherein the LO signal frequency is an integer multiple of the reference signal frequency, and wherein at least two PLL circuits of the set of PLL circuits are configured to output different frequency LO signals;

wherein a plurality of PLL circuits in the set of PLL circuits each output a phase deviation signal; and a PLL synchronization circuit configured to receive phase deviation signals from the plurality of PLL circuits, and output the common adjustment signal to each PLL circuit in the set of PLL circuits, wherein the PLL synchronization circuit is configured to synchronize operation of the plurality of PLL circuits.

2. The LO signal generating circuit of claim 1, further comprising:

one or more integer multiplier or divider circuits connected to one or more respective LO signal outputs and configured to multiply or divide the frequency of the LO signal by an integer value.

3. The LO signal generating circuit of claim 1, wherein a PLL circuit in the set of PLL circuits is not in the plurality of PLL circuits and does not output a phase deviation signal to the PLL synchronization circuit.

4. The LO signal generating circuit of claim 1, wherein:

the frequency input signal at each PLL circuit in the set of PLL circuits is the reference signal;

the PLL synchronization circuit comprises a phase error averaging circuit configured to:

receive the phase deviation signals, each comprising a local phase error signal, from the plurality of PLL circuits;

calculate an average phase error of the plurality of PLL circuits; and output the average phase error of the plurality of PLL circuits to each of the PLL circuits in the set of PLL circuits as the common adjustment signal; and each PLL circuit in the plurality of PLL circuits comprises:

a common mode loop filter configured to generate a common mode oscillator control signal based on the average phase error of the plurality of PLL circuits;

a difference mode loop filter configured to generate a difference mode oscillator control signal based on a difference between the PLL circuit's local phase error signal and the average phase error of the plurality of PLL circuits; and a summing circuit configured to output a sum of the common mode oscillator control signal and the difference mode oscillator control signal to a controlled oscillator.

5. The LO signal generating circuit of claim 4, wherein the common adjustment signal output from the PLL synchronization circuit is digital, and for each PLL circuit in the plurality of PLL circuits, the phase deviation signal, common adjustment signal, and oscillator control signal, are digital.

6. The LO signal generating circuit of claim 1, wherein:

the set of PLL circuits further comprises a primary PLL circuit which is not in the plurality of PLL circuits;

each PLL circuit in the plurality of PLL circuits is a secondary PLL circuit;

the frequency input signal to the primary PLL circuit is the reference signal;

the frequency input signal to each of the secondary PLL circuits is a divided LO signal of the primary PLL circuit, at the reference signal frequency;

the PLL synchronization circuit comprises the primary PLL circuit and a phase noise correction loop filter;

the phase noise correction loop filter is configured to receive a summation of the phase deviation signals from the plurality of PLL circuits, and output the common adjustment signal, wherein each phase deviation signal comprises a correction current based on a comparison of the phase of the divided output signal of a secondary PLL circuit and the divided LO signal of the primary PLL circuit;

the primary PLL circuit comprises a controlled oscillator adapted to receive a first control input signal based on a comparison of the phase of the divided LO signal of the primary PLL circuit and a second control input signal which is the common adjustment signal; and each secondary PLL circuit comprises a controlled oscillator each adapted to receive a first control input signal based on a comparison of the phase of the divided LO signal of that PLL circuit and the divided LO signal of the primary PLL circuit; and a second control input signal which is the common adjustment signal.

7. The LO signal generating circuit of claim 6, wherein the correction current output by each secondary PLL circuit as a phase deviation signal has a polarity opposite that of a current output by a charge pump used to generate the second control input of the controlled oscillator of the PLL circuit.

8. The LO signal generating circuit of claim 6, wherein the correction current output by each secondary PLL circuit as a phase deviation signal is scaled based on the number of secondary PLL circuits.

9. The LO signal generating circuit of claim 8, wherein the number of secondary PLL circuits is N, and each secondary PLL circuit is configured to scale its correction current by 1/N.

10. The LO signal generating circuit of any of claim 6, wherein the phase noise correction loop filter circuit has an impedance related to the number of secondary PLL circuits.

11. A multi-carrier transceiver for a wireless communication network node or wireless device, comprising:

a multi-frequency Local Oscillator (LO) signal generating circuit configured to receive one periodic reference signal and to generate and output a set of LO signals, the LO signal generating circuit comprising a set of Phase Locked Loop (PLL) circuits, each configured to receive a frequency input signal at the reference signal frequency and a common adjustment signal, and output an LO signal, wherein the LO signal frequency is an integer multiple of the reference signal frequency, and wherein at least two PLL circuits of the set of PLL circuits are configured to output different frequency LO signals, wherein a plurality of PLL circuits in the set of PLL circuits each output a phase deviation signal, and a PLL synchronization circuit configured to receive phase deviation signals from the plurality of PLL circuits, and output the common adjustment signal to each PLL circuit in the set of PLL circuits, wherein the PLL synchronization circuit is configured to synchronize operation of the plurality of PLL circuits;

mixers configured to frequency convert wireless communication signals between baseband and a plurality of RF carrier frequencies; and filters configured to suppress signal energy outside of a frequency band around each carrier frequency.

12. The multi-carrier transceiver of claim 11 wherein one or more LO signals, or integer multiples or divisions of LO signals, coincide in frequency, within a predetermined tolerance, with corresponding RF carrier frequencies.

13. A multi-carrier transceiver integrated circuit, IC, system for a wireless communication network node or wireless device, comprising:

a plurality of channels, each channel comprising:

an antenna switch connected to an external RF filter;

a receive chain of circuits comprising a low noise amplifier, frequency down-conversion mixer, filter, and analog to digital converter; and a transmit chain of circuits comprising a power amplifier, frequency up-conversion mixer, filter, and digital to analog converter; and a multi-frequency Local Oscillator (LO) signal generating circuit configured to receive one periodic reference signal and to generate and output a set of LO signals, the LO signal generating circuit comprising a set of Phase Locked Loop (PLL) circuits, each configured to receive a frequency input signal at the reference signal frequency and a common adjustment signal, and output an LO signal, wherein the LO signal frequency is an integer multiple of the reference signal frequency, and wherein at least two PLL circuits of the set of PLL circuits are configured to output different frequency LO signals, wherein a plurality of PLL circuits in the set of PLL circuits each output a phase deviation signal, and a PLL synchronization circuit configured to receive phase deviation signals from the plurality of PLL circuits, and output the common adjustment signal to each PLL circuit in the set of PLL circuits, wherein the PLL synchronization circuit is configured to synchronize operation of the plurality of PLL circuits;

wherein LO signals provided to the mixers in different channels have corresponding different frequencies, whereby the different channels are configured to process different carrier frequency signals.

14. The multi-carrier transceiver IC of claim 13, wherein the multi-carrier transceiver IC is disposed in User Equipment (UE) operative in a wireless communication network and further including processing circuitry operatively connected to the multi-carrier transceiver and configured to communicate with one or more nodes of a wireless communication network across a Radio Access Network.

15. The multi-carrier transceiver IC of claim 13, wherein the multi-carrier transceiver IC is disposed in a base station operative in a wireless communication network and further including processing circuitry operatively connected to the multi-carrier transceiver and configured to communicate with a plurality of User Equipment (UE) across a Radio Access Network.

* * * * *